United States Patent
Nagaraj (10) Patent No.: US 8,082,479 B2
(45) Date of Patent: Dec. 20, 2011

(54) METHODS AND APPARATUS FOR GENERATING PERMUTATIONS

(75) Inventor: Thadi M. Nagaraj, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1366 days.

(21) Appl. No.: 11/347,507

(22) Filed: Feb. 2, 2006

(65) Prior Publication Data

US 2007/0192655 A1    Aug. 16, 2007

(51) Int. Cl.
*H03M 13/00* (2006.01)
(52) U.S. Cl. ........................................... 714/755
(58) Field of Classification Search ............... 714/755, 714/702; 380/239, 26
See application file for complete search history.

(56) References Cited

U.S. PATENT DOCUMENTS

| | | | | |
|---|---|---|---|---|
| 6,411,222 B1 * | 6/2002 | Dorrell | ............................ | 341/50 |
| 6,549,998 B1 * | 4/2003 | Pekarich et al. | .............. | 711/220 |
| 2005/0283705 A1 * | 12/2005 | McNamara | .................... | 714/755 |
| 2006/0031737 A1 * | 2/2006 | Chugg et al. | .................. | 714/755 |

FOREIGN PATENT DOCUMENTS

| | | |
|---|---|---|
| EP | 0 986 182 A1 | 3/2000 |
| EP | 1 508 972 A1 | 2/2005 |
| EP | 1 567 217 A1 | 10/2005 |
| EP | 1 195 910 A2 | 11/2007 |
| JP | 2000353965 | 12/2000 |
| JP | 2001196941 A | 7/2001 |
| JP | 2001285077 A | 10/2001 |
| JP | 2002190743 A | 7/2002 |
| JP | 2004320434 | 11/2004 |
| KR | 1020030077644 | 10/2003 |
| WO | 00/38333 A1 | 6/2000 |
| WO | WO02069506 | 9/2002 |
| WO | 2004/025839 A1 | 3/2004 |
| WO | WO 2004025839 A1 * | 3/2004 |

OTHER PUBLICATIONS

Heegard, C. et al: "Turbo Coding" Turbo Coding, Kluwer International Series in Engineering and Computer Science, Boston, Ma: Klumer Academic Publication, US, 1999, pp. 50-54.
Crozier S. et al: "High-performance low-memory interleaver banks for turbo-codes" VTC Fall 2001. IEEE 54th. Vehicular Technology Conference. Proceedings. Atlantic City, NJ, Oct. 7-11, 2001, IEEE Vehicular Technology Conference, New York, NY: IEEE, US, vol. 1 of 4, conference 54, Oct. 7, 2001, pp. 2394-2398.
Ampadu, P et al: "An efficient hardware interleaver for 3G turbo decoding" Radio and Wireless Conference, 2003. Rawcon '03. Proceedings Aug. 10-13, 2003, Piscataway, NJ, USA. IEEE, Aug. 10, 2003, pp. 199-201.
International Search Report and Written Opinion—PCT/US2007/061579, International Search Authority—European Patent Office—May 8, 2007.

* cited by examiner

*Primary Examiner* — M. Mujtaba K Chaudry
*Assistant Examiner* — Enam Ahmed
(74) *Attorney, Agent, or Firm* — Ryan N. Farr (57) ABSTRACT

Methods and apparatus for determining at least one permutation of a set of a K number of values are disclosed. The methods and apparatus utilize a first permutation functionality that maps an index value to another value within the set of K values according to the first outputting the mapped value as a next value in the at least one permutation; setting the index value to a next index value according to a second predefined permutation function; and repeating mapping, outputting and setting until each operation is performed at least K number of times and a permuted sequence of the K number of values has been output.

47 Claims, 5 Drawing Sheets

METHODS AND APPARATUS FOR GENERATING PERMUTATIONS

BACKGROUND

1. Field

The present application relates to the generation of permutations and, more particularly, to generating pseudo-random permutations of a set of indices used for encoding information to be transmitted, such as via a wireless system.

2. Background

In encoding information, such as information to be transmitted in a wireless communication system, it is known to generate different random permutations of a number sequence. The more random the permutation, the more robust the data transmission will be and resilient against errors introduced during transmission of encoded data.

Figure 1:
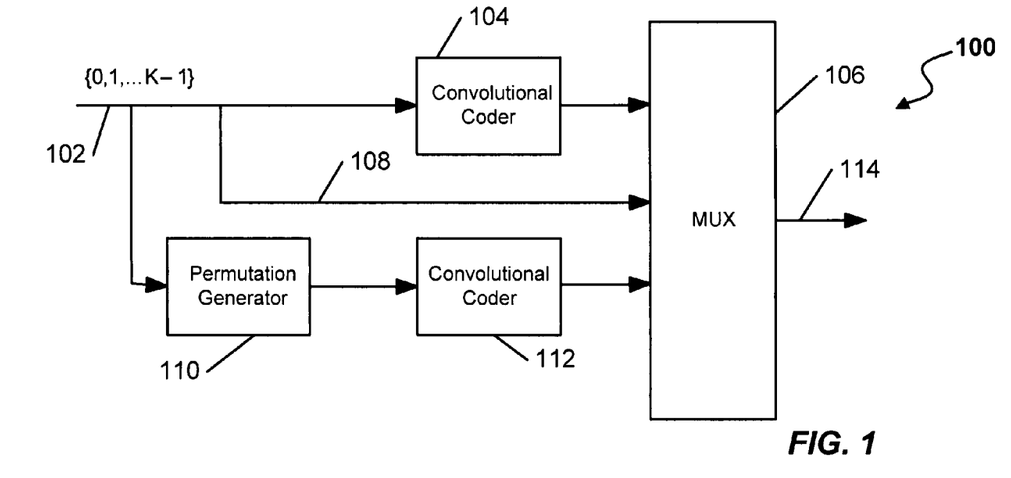
FIG. 1 is a block diagram of a turbo encoder including a permutation generator.

A particular example where permutations are utilized in encoding data includes a turbo encoder, which may be utilized in a wireless transmitter or transceiver, as examples. In particular, FIG. 1 illustrates a turbo encoder 100 that may be utilized in a wireless transceiver. The turbo encoder 100 receives an input of data signals identified by sequence of integers 102 (e.g., {0, 1, 2, ..., K–1}, where K is an integer). As may be seen in system 100, the sequence 102 is input to an upper convolutional coder 104 that encodes the sequence and outputs the resultant convoluntially encoded sequence to a multiplexer 106. The multiplexer 106 also includes an input 108 to which the unaltered sequence 102 is delivered. Finally, a lower leg includes a permutation generator 110 and a convolutional coder 112 connected in sequence.

In particular, the lower leg of the turbo encoder 100 generates its signals by first permuting the data signals identified by the integer sequence 102 according to a prescribed algorithm or methodology. Examples of known algorithms or methodologies will be discussed later.

After the sequence 102 is permuted by permutation generator 110, a convolutional code is then applied to this permuted sequence by the convolutional coder 112. In the example encoder 100, the data symbols from each of the convolutional coders 104 and 112 and the K data symbols 108 are multiplexed by multiplexer 106 to be output as turbo encoded symbols 114.

As mentioned above, the permutation generator 110 may employ specific algorithms or methodologies for generating different permutations of the sequence 102. One such approach is to generate random permutations using a random number generator to produce the permuted sequence. Accordingly both the encoder and decoder can utilize the same random number generator and a same initial seed number to produce the same sequence. This approach, however, is disadvantageous in that each of the encoder and decoder must store the generated permuted sequence in memory. Accordingly, for large values of K and for a large number of different permutations, the amount of memory required for storing such permutations is costly.

Another approach that is known to generate permutations includes using a rectangular array. As an example, it is assumed that a permutation of numbers from 0 to 9 is desired. These numbers may be written into a rectangular array of a size two rows by five columns (2×5). The numbers zero through nine are then inserted in sequence into the rows and read out from the columns. An exemplary resultant array is illustrated as follows:

| 0 | 1 | 2 | 3 | 4 |
|---|---|---|---|---|
| 5 | 6 | 7 | 8 | 9 |

As may be seen from the array above, a permuted sequence that would be generated by reading out the numbers by columns is {0, 5, 1, 6, 2, 7, 3, 8, 4, 9}. It will be appreciated by those skilled in the art that by choosing arrays of row and column numbers, different permutations can be generated. A disadvantage of this approach, however, is that the resultant sequences may not posses a sufficient degree of randomness, thus not providing a robust permutation.

A further methodology used for generating permutations of a sequence that is known includes use of a linear congruential technique. In particular, in such techniques a number $A_0$ is chosen between 0 and K–1. Next, a recursive function is defined such that $A_n$ equals $(aA_{n-1}+b)$ mod K for values of $n=1, 2, \ldots, K-1$, where n is an integer. Along with this defined function, a number of conditions must also be met. The first condition is that the values a and b are less than K. Additionally, b must be relatively prime to K. Furthermore, the value (a–1) must be a multiple of p, for every prime number p dividing K. Additionally, the value (a–1) is a multiple of 4 if the value K is also a multiple of 4. Finally, it is desirable that a is relatively prime to K.

As an example of this technique, it is assumed that the value K=9, the prime factor is p is 3, and a value of a is chosen such that (a–1)=3x. Accordingly, if a equals 4 and b equals 7 and $A_0$ equals 5, the generated permuted sequence would be {5, 0, 7, 8, 3, 1, 2, 6, 4}. A drawback to this approach, however, is that for a prime value of K, the only value of a that can be picked is 1. Accordingly, different permutations differ only in the value of $A_0$ and b limiting the randomness that can be achieved.

Figure 2:
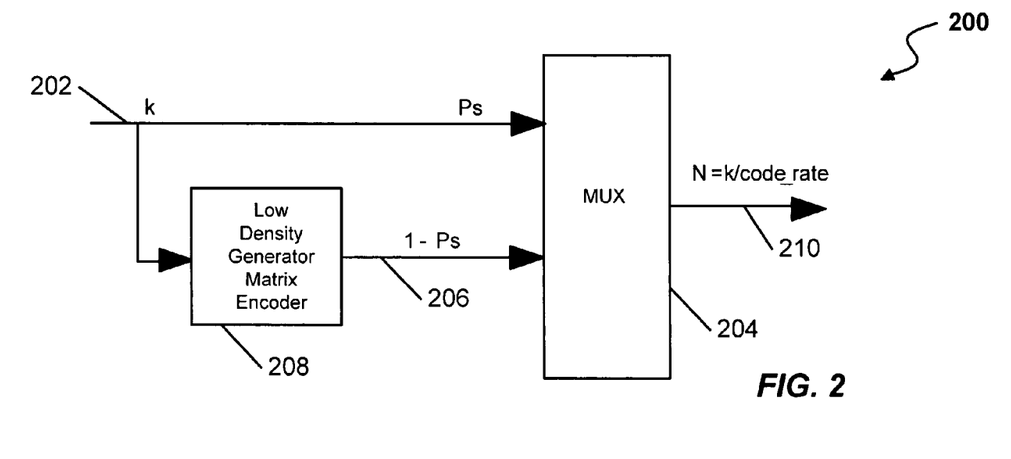
FIG. 2 is a block diagram of an encoder using a low density generator matrix, which, in turn, utilizes at least one permutation generator.

As another example of a type of encoder known in the art utilizing permutations, FIG. 2 illustrates an encoder 200 utilizing a Low Density Generator Matrix encoder. As illustrated, the system receives an input sequence 202 that is delivered directly to a multiplexer 204 as well as a permuted sequence 206 output from a Low Density Generator Matrix encoder 208. Within the Low Density Generator Matrix encoder 208, coded symbols are generated by parallel concatenation of codes, which, in turn, consist of a permutation of K number of data symbols and a block code that encodes blocks of the permuted sequence. These block code symbols are combined together by the multiplexer 204 after being output in parallel 206 from the low density generator matrix 208. Again, the permutations performed by the low density generator matrix 208 may be effected by any of the known algorithms or methodologies described above. Accordingly, because each of the permutation algorithms or methods discussed has drawbacks, the low density generator matrix 208 accordingly suffers the same drawbacks.

SUMMARY

According to an aspect of the present disclosure, a method for determining at least one permutation of a set of a K number of values is disclosed. The method includes initializing an index value to a set value within the set of K values and mapping the index value to a first permuted value within the set of K values according to a first predefined permutation function. The method further includes outputting the first permuted value as a first value in the at least one permutation, generating a next index value based on the index value according to a second predefined permutation function, and mapping the next index value to a second permuted value within the set of K values according to the first predefined permutation function.

According to another aspect, a machine-readable storage medium is disclosed including a set of instructions for determining at least one permutation of a set of a K number of values. The set of instructions includes an instructions for initializing an index value to a set value within the set of K values. The set further includes an instruction for mapping the index value to a first permuted value within the set of K values according to a first predefined permutation function, and an instruction for outputting the first permuted value as a first value in the at least one permutation. Also included are an instruction for generating a next index value based on the index value according to a second predefined permutation function; and an instruction for mapping the next index value to a second permuted value within the set of K values according to the first predefined permutation function.

In yet another aspect, a permutation generator is disclosed for determining at least one permutation of a set of a K number of values. The generator includes a seed index generator configured to initialize an index value to a set value within the set of K values and a first permutation unit configured to map the index value to a first permuted value within the set of K values according to a first predefined permutation function and to output the first permuted value as a first value in the at least one permutation. The generator also includes a second permutation unit configured to generate a next index value based on the index value according to a second predefined permutation function and to output the next index value to the first permutation generator.

According to still another aspect, a transceiver for use in a communication system is disclosed. The transceiver includes at least one of an encoder and a decoder for encoding or decoding wireless signals through the use of at least one permutation, and a permutation generator for determining the at least one permutation of a set of a K number of values. The permutation generator, in particular, further includes a seed index generator configured to initialize an index value to a set value within the set of K values, a first permutation unit configured to map the index value to a first permuted value within the set of K values according to a first predefined permutation function and to output the first permuted value as a first value in the at least one permutation, and a second permutation unit configured to generate a next index value based on the index value according to a second predefined permutation function and to output the next index value to the first permutation generator.

According to yet one more aspect, an apparatus for determining at least one permutation of a set of a K number of values is disclosed. The apparatus includes means for initializing an index value to a set value within the set of K values, means for mapping the index value to a first permuted value within the set of K values according to a first predefined permutation function, means for outputting the first permuted value as a first value in the at least one permutation, means for generating a next index value based on the index value according to a second predefined permutation function, and means for mapping the next index value to a second permuted value within the set of K values according to the first predefined permutation function.

DETAILED DESCRIPTION

The present disclosure discloses methods and apparatus for generating permutations that are pseudo-random and may also be for sequences of arbitrary length. The presently disclosed methods and apparatus afford iteration of permutations having sufficient randomness to provide robust encoding while utilizing minimal amounts of memory even for large values of K and large numbers of different permutations. This is achieved by utilizing a first permutation generator to determine permuted values based on an input index and a second permutation generator to provide a permuted sequence of next index values to be used for each subsequent index value input into the first permutation generator.

Figure 3:
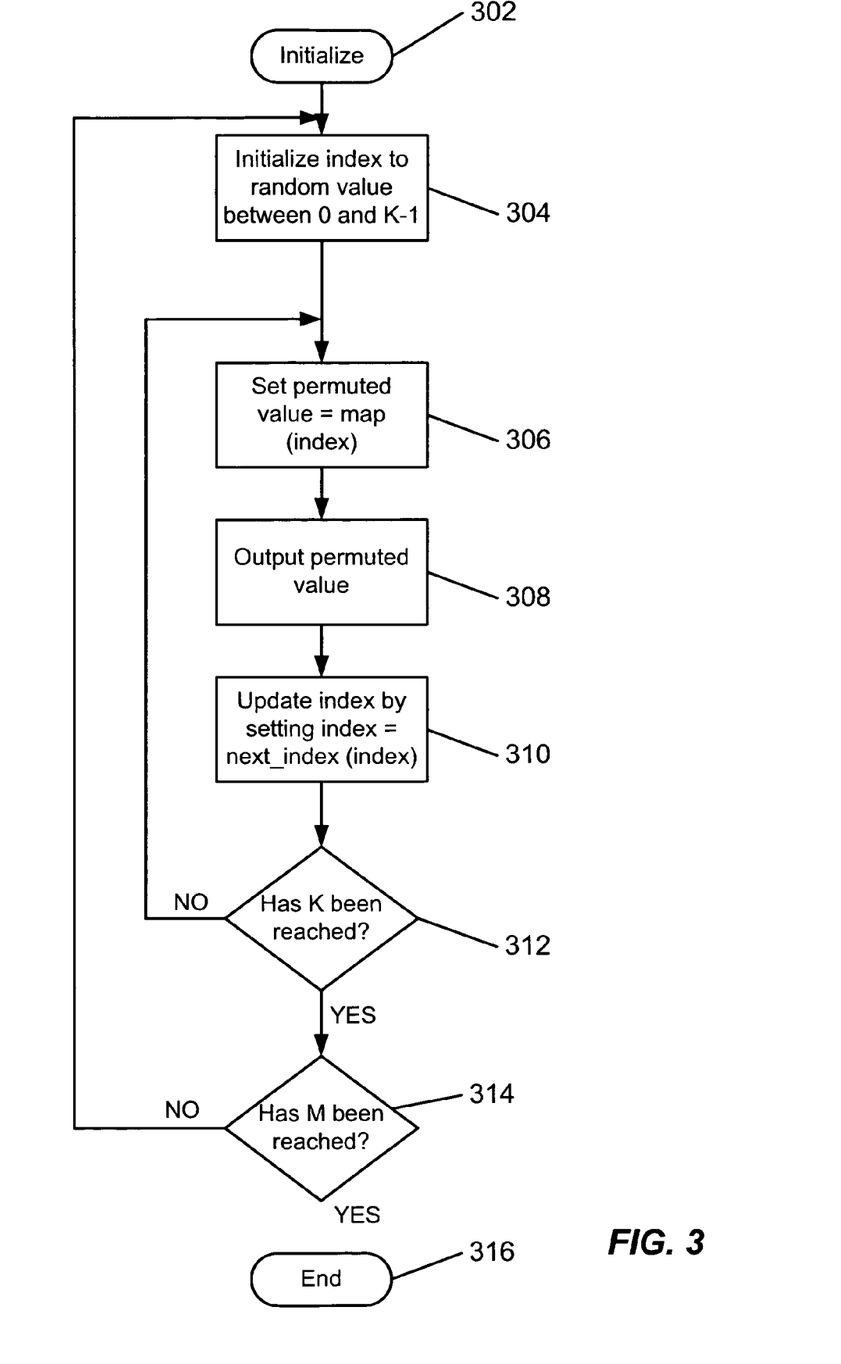
FIG. 3 is a flow diagram of a method for generating one or more permuted sequences according to the present disclosure.

FIG. 3 illustrates a procedure for generating permutations according to the present disclosure. As illustrated the process 300 is initialized at block 302. Flow proceeds to block 304 where an index is initialized to some random value between zero and K−1. This value, termed a 'seed', may be derived with a random number generator or similar function. Additionally, it is noted that the methodology of FIG. 3 may instead also utilize a fixed seed value, rather than a random number generated.

After the initial index is determined in block 304, flow proceeds to block 306 where a permuted value is set equal to a mapped value of the index as indicated in block 306. The particular mapping function used to set the permuted value will be discussed in detail below. Flow then proceeds to block 308 where the permuted value is output as a first index in a permuted sequence of the original sequence of zero to K−1 numbers.

After the permuted value has been output in block 308, flow proceeds to block 310 where an index is updated by setting the value of the index equal to a next index determined recursively based on the current index as illustrated in block 310. This index function will be described in further detail below. After the index value has been set, flow proceeds to decision block 312.

At block 312, a determination is made as to whether a K number of iterations of the processes effected in blocks 306, 308, and 310 have been performed. If not, flow proceeds back to block 306 to repeat the processes of blocks 306, 308, and 310 in order to achieve further values of the permuted sequence. Once a K number of iterations have been performed as determined in block 310, the permutation is complete. Flow then proceeds to decision block 314, for a determination of whether an M number of permutations has been generated. It is noted that the number of desired permutations (M) could be one or more, dependent solely on user preferences or system requirements. After an M number of permutations is generated, as determined in block 314, the process 300 is terminated at termination block 316.

It is noted that the process of FIG. 3 may be executed any number of desired times in order to generate a set of different permutated sequences of the original sequence zero to K−1. By utilizing a random seed value, each permutation is independently generated. Additionally, updating the index values for each subsequent mapping provides a method for establishing a robust and random permutation without the need to utilize significant system resources such as memory.

With respect to the mapping function of block 306 of FIG. 3, one technique for generating permutations to insert the numbers from zero to K−1 into a rectangular array row-wise. This enables the entries into the array to be then read out column-wise to produce a permutation of the original sequence, as was discussed previously in the present disclosure. The height of the rectangular array is constrained only by ensuring that the height a is some prime number less than K. Accordingly, a width of the rectangular array, denoted by "b," is constrained only in that b equals K divided by a.

$$\left(b = \frac{K}{a}\right).$$

For values of K and a that yield a width value b having a remainder, the value b is simply rounded up to the next integer value to make an array, which inherently has integer numbers of rows and columns.

The elements of the original sequence (i.e., zero through K−1) are then inserted row-wise into the rectangular array. As an example, it is assumed that the value of K equals 10, the height a equals three rows and the width b equals four columns. The resulting rectangular array would look as follows in Table 1:

TABLE 1

| 0 | 1 | 2  | 3  |
|---|---|----|----|
| 4 | 5 | 6  | 7  |
| 8 | 9 | 10 | 11 |

Next, the elements are then read along the columns with the resultant sequence being (0, 4, 8, 1, 5, 9, 2, 6, 10, 3, 7, 11). Thus, a one-to-one map from the original sequence may be given by the following Table 2:

TABLE 2

| element | map(element) |
|---------|--------------|
| 0       | 0            |
| 1       | 4            |
| 2       | 8            |
| 3       | 1            |
| 4       | 5            |
| 5       | 9            |
| 6       | 2            |
| 7       | 6            |
| 8       | 10           |
| 9       | 3            |
| 10      | 7            |
| 11      | 11           |

It is noted, however, in the example above that the elements of the original sequence (0 through 9) map to values beyond this set (i.e., 10 and 11). Notwithstanding, it is noted that the original array element 10 maps to a permuted index of 7, which is in the required range of the original sequence of numbers. Accordingly, the mapping function can be defined to remap a mapped element that falls outside the range of the original sequence of numbers, by referencing the index value (element in Table 2 above) equal to that mapped element and then using the mapped element that resulted from the mapping of that element, which falls within the original number. As an illustration in the example provided the element having a value of eight (8), which first maps to a value of ten (10), is remapped to a value of seven (7), which is the value of the mapped element resulting from an index value of ten (10) in the array and is within the required range from 0 to 9. Accordingly, using this scheme to map the function for the present example is given in the Table 3 below:

TABLE 3

| element | Mapped element    |
|---------|-------------------|
| 0       | 0                 |
| 1       | 4                 |
| 2       | 8                 |
| 3       | 1                 |
| 4       | 5                 |
| 5       | 9                 |
| 6       | 2                 |
| 7       | 6                 |
| 8       | 7 (mapped via 10) |
| 9       | 3                 |

As a further example of this mapping function, the following pseude-code written in C+ code is an exemplary implementation that may be used to execute the above-described map function.

unsigned int map (unsigned int index, unsigned int a, unsigned int b)

```
{
    unsigned int rv = 0;
    unsigned int I, J;
    J = index%a;
    I = (index − J)/a;
    rv = I + J*b;
    if(rv >= K)
    {
        rv = map(rv, a, b);
    }
    return rv;
}
``` where rv is the permuted value returned for an input index value. It is noted that the above code returns the rv value unless that value is equal to or exceeds the value K. In such case, the map function is once again executed utilizing the computed rv value as the index value, rather than a new, entered index. This functionality thus ensures that the permuted value returned will not fall outside the range of values from 0 to K−1.

It is noted that, referring back to FIG. 3, that this function is executed once at block 306 to output a permuted value (i.e., return rv) and the seed index value will be changed by the next index function executed in block 310 prior to execution of the mapped function in block 306, which will be described in detail below. Concerning the next_index function, executed in block 310 of FIG. 3, the following example provides an exemplary way of providing a change of index for each iteration of the map function. In our first example, the next_index function could simply be in increment of a value of one for each execution of the next_function (e.g., next_index=(index+1) modulo (K)).

Using only the method of this first exemplary permutation generation (e.g., the above mapping function), however, does not necessarily yield the best quality random permutations. Accordingly, a further second permutation is performed for those each permuted value generated by the first exemplary permutation generation to determine a new index for a next execution of the mapping function. That is, this second permutation includes determining or generating a next index using a permutation of the original sequence since the height a of the rectangular array is a prime number.

In particular, this may be done using a recursion such as $A_n=(A_n-1+c)$ modulo (a) where the value c is some prime number less than a and the initial value of $A_0$ equals zero. Accordingly, using the example above where K equals 10, a equals 3, b equals 4, and the number c is set to a value of 2, the resultant permutation of the sequence $\{0, 1, \ldots (a-1)\}$ would be a permutation of the sequence $\{0, 1, 2\}$ to $\{2, 1, 0\}$. This permutation is effectively a resultant permutation of the rows of the rectangular array. That is, row 0 is permuted to row 2, row 1 is permuted to row 1, and row 2 is permuted to row 0. Using this scheme, the resultant mapping of this permutation using an example with K=10, a=3, and b=4 is shown in the Table 4 below:

TABLE 4

| 8 | 9 | 10 | 11 |
|---|---|----|----|
| 4 | 5 | 6  | 7  |
| 0 | 1 | 2  | 3  |

Similarly, the columns of the rectangular array may be permuted by permutation of the sequence $\{0, 1, \ldots (b-1)\}$. Accordingly, column zero and column 3 remain unchanged, whereas columns 1 and 2 are permuted such that they are juxtaposed with the resulting mapping of the rectangular array given in Table 5 below:

TABLE 5

| 8 | 10 | 9 | 11 |
|---|----|---|----|
| 4 | 6  | 5 | 7  |
| 0 | 2  | 1 | 3  |

After permutation of both the rows and columns of the rectangular array, further randomness may be by reading the entries of the resultant array diagonally. That is, reading is started from row zero and column zero and incremented row by row plus 1 modulo a in incremented column by column plus 1 modulo b. This results in a sequence, given the example above, of $\{8, 6, 1, 11, 4, 2, 9, 7, 0, 10, 5, 3\}$. Since the entries that are greater than or equal to the value K are not meaningful, these entries are skipped to yield the resultant sequence $\{8, 6, 1, 4, 2, 9, 7, 0, 5, 3\}$.

The following Table 6 illustrates the resultant permuted sequence of the indices:

TABLE 6

| index | next_index |
|-------|------------|
| 0     | 5          |
| 1     | 4          |
| 2     | 9          |
| 3     | 8          |
| 4     | 2          |
| 5     | 3          |
| 6     | 1          |
| 7     | 0          |
| 8     | 6          |
| 9     | 7          |

This above-described index function may be executed by the following code in C+ language:
    unsigned int next_index (unsigned int index)

```
{
    unsigned int rv = 0;
    int I, J;
    J = index%b;
    I = (index − J)/b;
    do
    {
        J = J + 2;
        if (J >= b)
        {
            if (J%2 == 0)
            {
                J = 1;
            }
            else if (J%2 == 1)
            {
                J = 0;
            }
        }
        I = (I + B)%a; // B is a prime number smaller than a
        rv = (I*b + J);
    } while (rv >= K);
return rv;
}
```

The process of FIG. 3 affords ability for each permutation to be defined by only two numbers a and the initial randomly determined seed "index" value. As described above, however, the initial index value may also be predetermined and thus each permutation may simply be defined by one number a, although a randomly determined seed may provide more robust and random permutations. The values for a are only constrained by the number being prime, but a may be chosen randomly from a table of prime numbers nonetheless. Furthermore, the value of a is constrained as being less than the value K. An additional degree of quality may also be obtained if it is ensured that the number b is relatively prime to a. As may be appreciated by one skilled in the art, the mapping and next index functions described above are merely exemplary and many different functions and code sequences may be utilized to permute both the mapped values and for determining next index values to be used. By requiring only an initial seed index value and a chosen value a, the above method is useful in communication systems since only these two values need to be communicated from a transmitter to receiver for use by a decoder therein to determine the initial sequence from the permuted sequence.

As an illustration of how the process of FIG. 3 determines an actual permuted sequence, the following example is provided. In this example, the values and tables used previously will be used for the sake of simplicity. For the example described above, the value of K was set at 10 and the value of a set at 3. The result of the permuted sequence of the map function may be seen in Table 3 presented above. An example of the result of the next_index function is illustrated above by Table 6 showing a new index returned based on an input index.

Assuming, as an example, that the initial seed or index is 7, whether randomly generated or deliberately chosen, the mapping function and the next index function as discussed above and shown in FIG. 3 yield a permutation sequence having a robust pseudo-randomness. As an illustration of a generated permuted sequence resulting, may be seen in the Table 7 below, the initial index is 7.

TABLE 7

| Index sequence | Mapped_val sequence | Next_index sequence |
|---|---|---|
| 7 | 6 | 0 |
| 0 | 0 | 5 |
| 5 | 9 | 3 |
| 3 | 1 | 8 |
| 8 | 7 | 6 |
| 6 | 2 | 1 |
| 1 | 4 | 4 |
| 4 | 5 | 2 |
| 2 | 8 | 9 |
| 9 | 3 | 7 |

When input to the mapping function (block 306 of FIG. 3), the value output is 6, which is then the first value in the permuted sequence that is output (e.g., block 308 of FIG. 3). After output of the first value of the permuted sequence, which is the middle column of Table 7 labeled as mapped_val sequence. After the mapping function has determined the first value, the next index function (e.g., block 310 in FIG. 3) determines a next index based on the previous index value. In the example above, the index value of 7 is input into the index function, which yields an output value of 0, as may be seen in the first row of the third column of Table 7.

As illustrated in block 312 of FIG. 3, after the next index value is determined and a K number of permuted values have not yet been generated, the process returns to determine a next mapped value (i.e., permuted value) utilizing the new index value determined in block 310. As illustrated in the second row of Table 7, the determined new index value of 0 is used as the index value input to the mapping function. An input value of 0 yields a permuted output value of 0 also as shown. Thus, the second permuted value in the permutation being generated is 0.

The index value 0 is then input to the next index function, which returns a value of 5 for the next index value. This new index is then used, in turn, to determine the next permuted value of 9, and so on. As may be seen in FIG. 3, the mapping function and next index function are repeated a K number of times to yield a permuted sequence of K values. Accordingly, assuming, as only an example, that the initial seed or index is 7, the permutation generated is {6, 0, 9, 1, 7, 2, 4, 5, 8, 3} as may be seen in Table 7.

Figure 4:
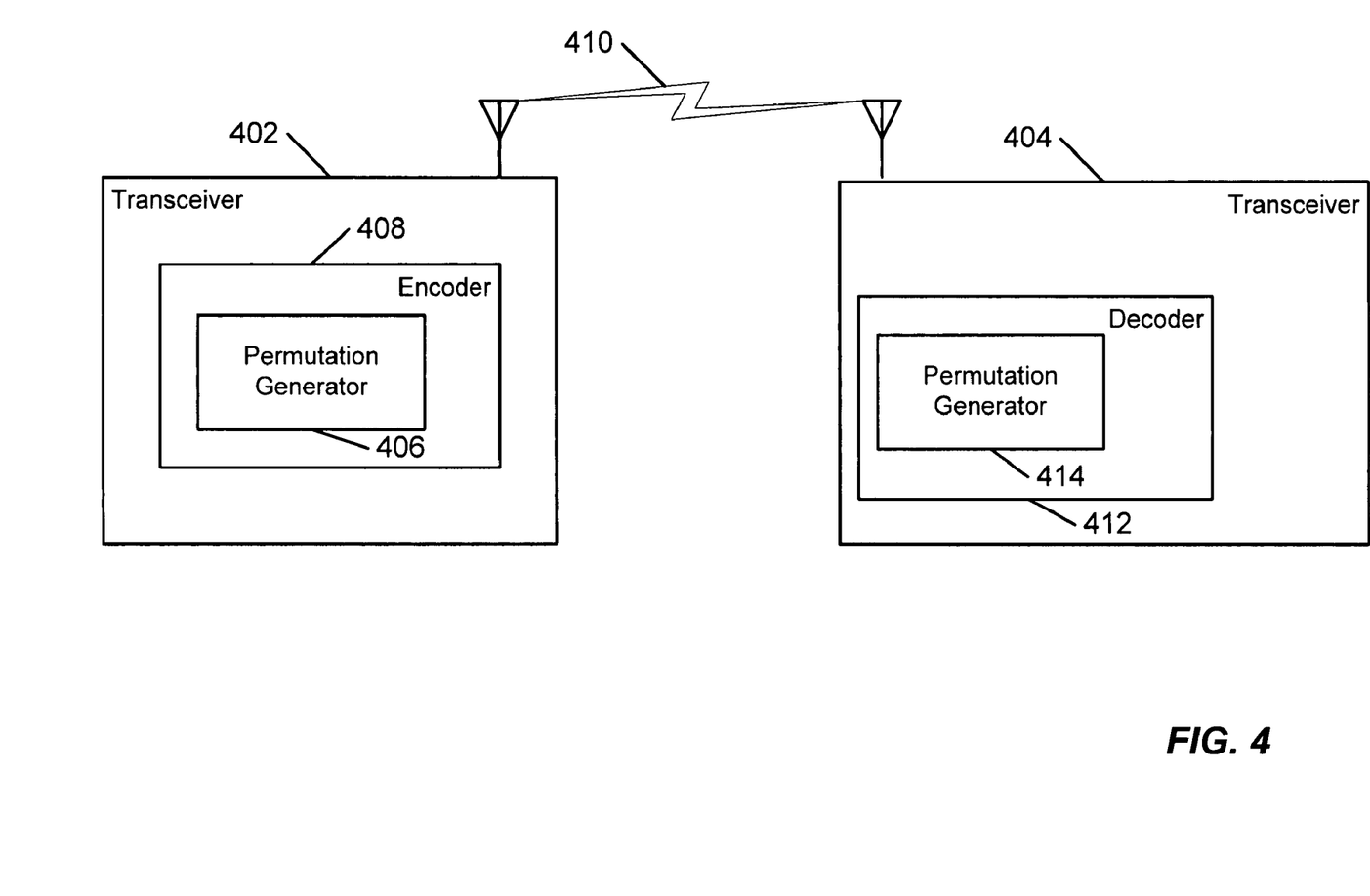
FIG. 4 is block diagram of a communication system employing at least one permutation generator in accordance with the present disclosure.

FIG. 4 illustrates an exemplary communication system in which the methodology of FIG. 3 may be employed. In particular, FIG. 4 illustrates a communication system 400 having at least two transceivers 402 and 404 in the communications system 400. At least one of the transceiver devices (402 or 404) includes a permutation generator 406 used by an encoder 408 for encoding transmission symbols to be transmitted. The encoder 408 may, for example, be a turbo encoder such as disclosed in FIG. 1 or an encoder using a low density generator matrix as illustrated in FIG. 2. In either case, the permutation generator 406 operates according to the process illustrated in FIG. 3. Accordingly, when a signal is transmitted, such as a wireless signal transmission 410, the value of "a" need only be transmitted to a transceiver 404 receiving the encoded transmission 410 if the initial seed is known in the system 400, or alternatively, only the value of "a" and the initial seed index value need be communicated to the other transceiver for decoding the encoded message. This affords encoding and decoding in the communications system 400 that does not require much system resources in contrast to systems storing permutations in memory. In the example shown, one of the transceivers is shown with a decoder 412 that works in connection with a permutation generator 414 to decode the encoded transmission. The generator 414 is complementary to generator 406 and is able to generate the original sequences from the received permutations by utilizing the value of "a" and, if applicable, the initial seed index value, both of which may be transmitted with the encoded transmission.

Figure 5:
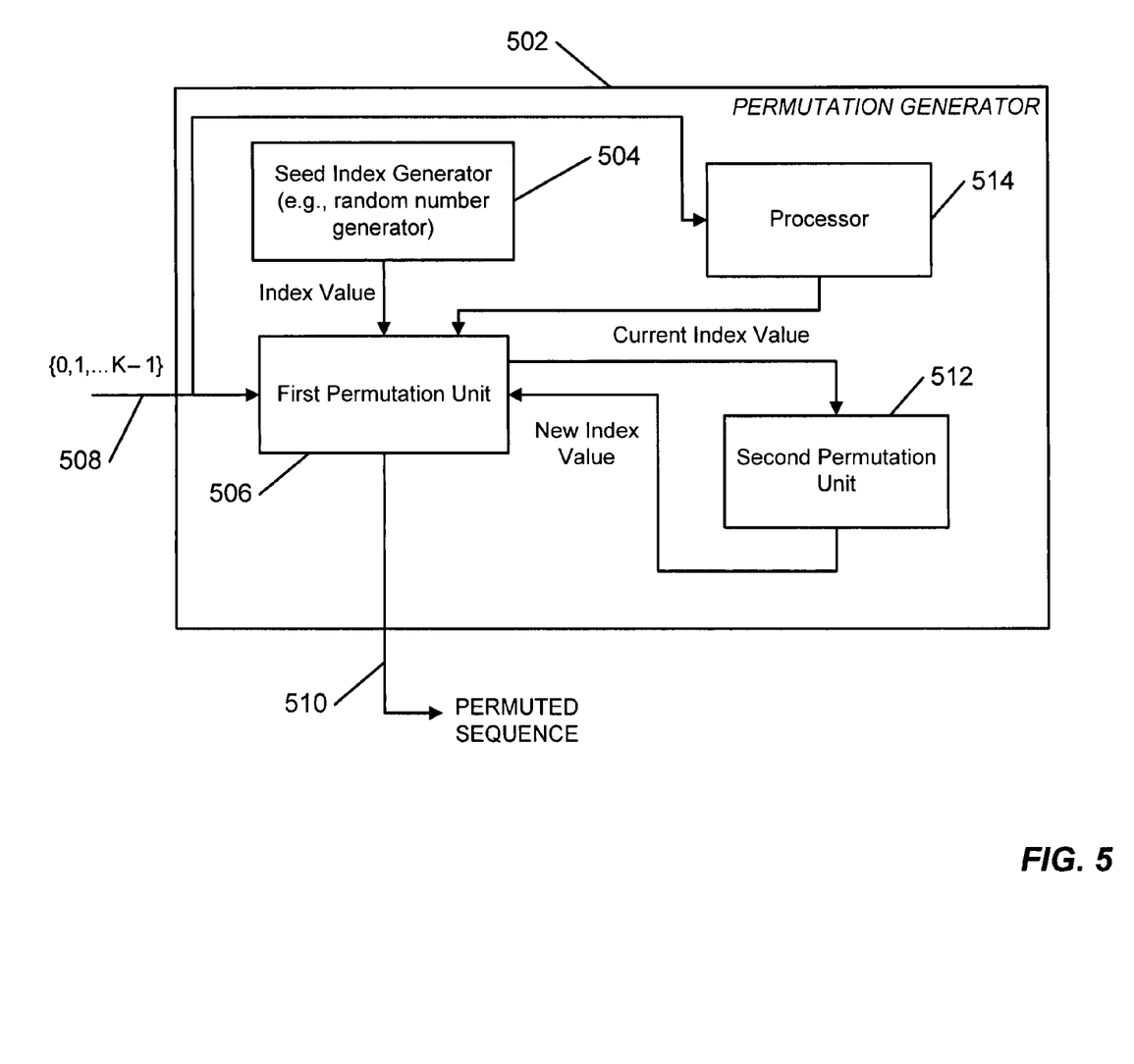
FIG. 5 is an exemplary block diagram of a permutation generator according to the present application that my be used in the systems

FIG. 5 illustrates an exemplary block diagram of a permutation generator 500 that may be utilized in the system of FIG. 4 and the encoders illustrated in FIGS. 1 and 2. As shown, the generator 500 may include a seed index generator 504, such as a random number generator. As discussed previously, however, this seed index generator is optional if an initial seed is known to all devices using the permutation generator.

Generator 500 includes a first permutation unit or generator 506, which receives an original sequence of 0 to K-1 integers 508 to be permuted. The first permutation generator may execute the mapping function as described above, where, given a starting index value (such as from seed index generator 504) within the range of 0 to K-1 integers, a permuted value may be obtained. This value may then be output to an output 510, which may deliver the permuted sequence to a device such as an encoder.

As further illustrated in FIG. 5, the first permutation generator delivers the current index value to a second permutation unit or generator 512. This generator 512 may employ the next_index function as described above where a different, permuted index value is generated from an input index value. The generator then returns a next index value to the first permutation generator for determination of a next permuted value for the permuted sequence.

It is noted that the generator 500 may include a processor 514 or equivalent device or functionality for determining the array parameters "a" and "b" given a value K, which are used by the first and second permutation generators in calculating their respective values. Further, either the processor 514, or generators 506 or 508 could keep track of whether all of the values in sequence 506 have been permuted (i.e., permuted values calculated for all K number of values). It is further noted that the generator 500 could be implemented as software running on one or more processors, hardware, or firmware.

Figure 6:
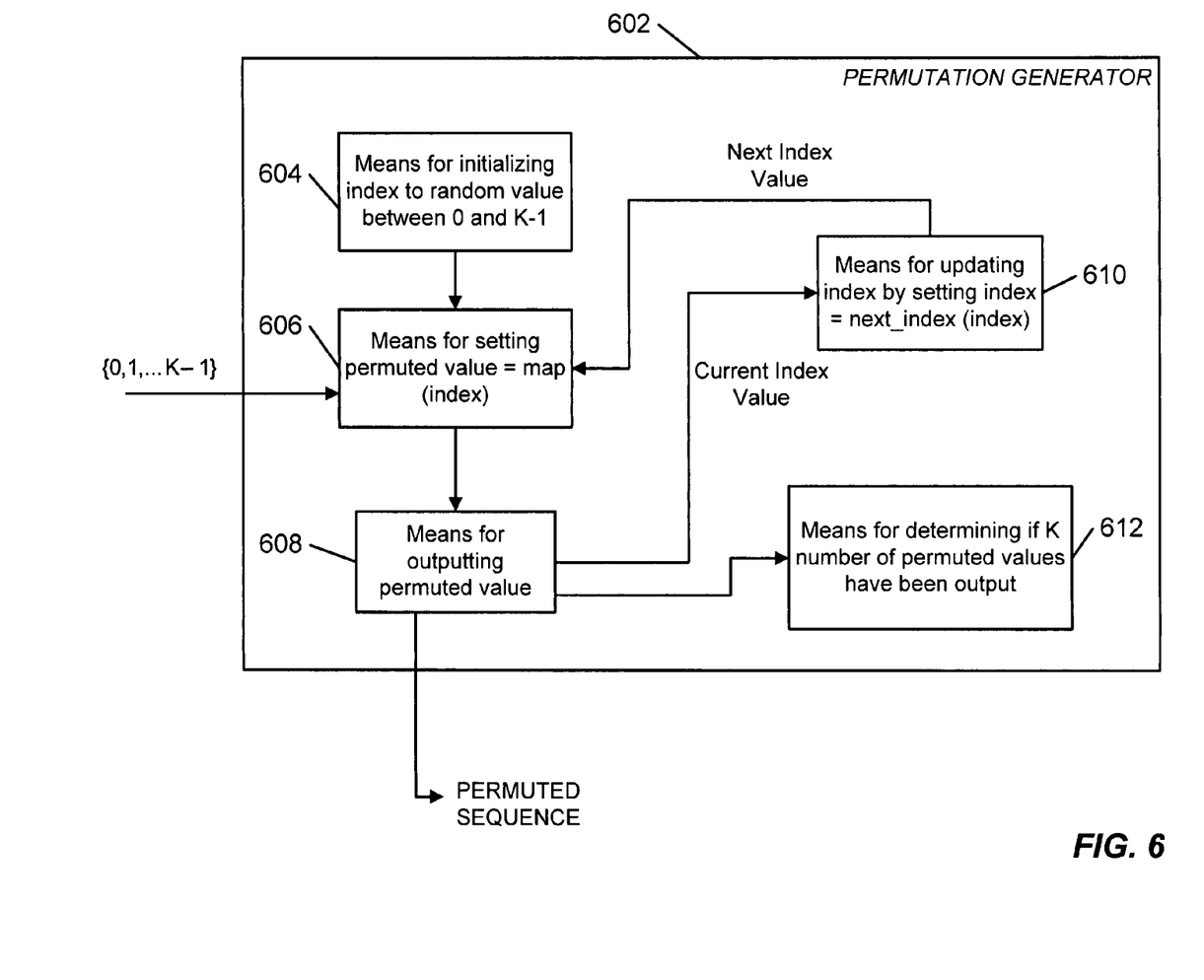
FIG. 6 is another exemplary block diagram of another permutation generator in accordance with the present disclosure.

FIG. 6 illustrates is another exemplary block diagram of another permutation generator in accordance with the present disclosure. As shown, the generator 602 includes means 604 for initializing an index or seed to some random value between 0 and K-1. As mentioned previously, however, the use of such a means may be optional if a predetermined starting index value is used. Means 604 outputs the index value to means 606 for determining or setting a permuted value equal to a result of a mapping function that returns a mapped element or permuted value as a function of the index (i.e., map (index)). Means 606 then delivers the resultant permuted value to means 608 for outputting permuted the value. Additionally, means 606 provides the current index value to means 610 for updating the index (i.e., determining a new index value) using, for example, the next_index function described above as a function of the current index value (i.e., setting index=next_index (index)). Means 610 returns a next index value to means 606 to be used in mapping the next value in the received sequence of K values.

Generator 602 also includes means 612 for determining if K number of permuted values have been output. When the K number of permuted values has been mapped by means 606, the generator stops processing until a next sequence of K numbers is input. It is noted that the elements of generator 602, may be implemented in hardware, firmware or software, such as instruction stored on a machine-readable storage medium.

The methods or algorithms described in connection with the examples disclosed herein may be embodied directly in hardware, in a software module executed by a processor, firmware, or in a combination of two or more of these. A software module may reside in RAM memory, flash memory, ROM memory, EPROM memory, EEPROM memory, registers, a hard disk, a removable disk, a CD-ROM, or any other form of storage medium known in the art. An exemplary storage medium is coupled to the processor, such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The examples described above are merely exemplary and those skilled in the art may now make numerous uses of, and departures from, the above-described examples without departing from the inventive concepts disclosed herein. Various modifications to these examples may be readily apparent to those skilled in the art, and the generic principles defined herein may be applied to other examples, e.g., in an instant messaging service or any general wireless data communication applications, without departing from the spirit or scope of the novel aspects described herein. Thus, the scope of the disclosure is not intended to be limited to the examples shown herein but is to be accorded the widest scope consistent with the principles and novel features disclosed herein. The word "exemplary" is used exclusively herein to mean "serving as an example, instance, or illustration." Any example described herein as "exemplary" is not necessarily to be construed as preferred or advantageous over other examples. Accordingly, the novel aspects described herein is to be defined solely by the scope of the following claims.

What is claimed is:

1. A method for transmitting symbols, comprising:
   determining at least one permutation of a set of K number of values comprising:
      initializing, by a processor, a first index value to a set value within the set of K values;
      generating a first permuted value by inputting the first index value into a first permutation function;
      outputting the first permuted value as a first value in the at least one permutation;
      generating a second index value based on the first index value by inputting the first index value into a second permutation function; and
      generating a second permuted value by inputting the second index value into the first permutation function; and
      outputting the second permuted value as a second value in the at least one permutation; and
   encoding the symbols based on the at least one permutation.

2. The method as defined in claim 1, further comprising, for each of the remaining K number of values:
   determining a next index value by inputting the previous index value into the second permutation function;
   generating a next permutation value by inputting the next index value in the first permutation function; and
   outputting the next permuted value as the next value in the at least one permutation.

3. The method as defined in claim 2, further comprising:
   determining at least a second permutation after determination of the at least one permutation.

4. The method as defined in claim 1, wherein the set value is a random number determined by a random number generator.

5. The method as defined in claim 1, wherein generating the first permuted value by inputting the first index value into the first predefined permutation function includes mapping the first index value to an array having an a number of rows and a b number of columns, where a is a prime number less than K and b is set to at least the value of K/a.

6. The method as defined in claim 5, wherein the first permutation function effects the operation of writing the set of K number of values into the array row-wise and then reading the values out of the array column-wise to achieve a set of permuted mapped elements.

7. The method as defined in claim 6, wherein the first permutation function includes further remapping of a mapped permuted element having a value greater than the number of K values by using that element to remap when the array is sized such that the product of a and b is greater than K.

8. The method as defined in claim 5, wherein the second permutation function effects a permutation of the numbered rows of the array and a permutation of the numbered columns of the array to generate a permutation of the index values within the array.

9. The method as defined in claim 5, wherein the second permutation is a recursion function defined by the relationship $A_n=(A_n-1+c)$ modulo (a) where $A_n$ is the permuted index value, the value c is a prime number less than a, and an initial value of $A_0$ is defined to be zero.

10. A machine-readable storage medium including a set of instructions for determining at least one permutation of a set of a K number of values, the set of instructions comprising:
    an instruction for initializing a first index value to a set value within the set of K values;
    an instruction for generating a first permuted value by inputting the first index value into a first permutation function;
    an instruction for outputting the first permuted value as a first value in the at least one permutation;
    an instruction for generating a second index value based on the first index value by inputting the second index value into a second permutation function;
    an instruction for generating a second permuted value by inputting the second index value into the first permutation function; and
    outputting the second permuted value as a second value in the at least one permutation.

11. The machine-readable storage medium as defined in claim 10, wherein the set of instructions further comprises, for each of the remaining K number of values:
    an instruction for determining a next index value by inputting the previous index value into the second permutation function;
    an instruction for generating a next permutation value by inputting the next index value into the first permutation function; and
    an instruction for outputting the next permuted value as the next value in the at least one permutation.

12. The machine-readable storage medium as defined in claim 11, wherein the set of instructions further comprises:
    determining at least a second permutation after determination of the at least one permutation.

13. The machine-readable storage medium as defined in claim 10, wherein the set value is a random number determined by a random number generator.

14. The machine-readable storage medium as defined in claim 10, wherein the instruction for generating the first permuted value by inputting the first index value into the first predefined permutation function includes mapping the first index value to an array having an a number of rows and a b number of columns, where a is a prime number less than K and b is set to at least the value of K/a.

15. The machine-readable storage medium as defined in claim 14, wherein the first permutation function effects the operation of writing the set of K number of values into the array row-wise and then reading the values out of the array column-wise to achieve a set of permuted mapped elements.

16. The machine-readable storage medium as defined in claim 15, wherein the first permutation function includes further remapping of a mapped permuted element having a value greater than the number of K values by using that element to remap when the array is sized such that the product of a and b is greater than K.

17. The machine-readable storage medium as defined in claim 14, wherein the second permutation function effects a permutation of the numbered rows of the array and a permutation of the numbered columns of the array to generate a permutation of the index values within the array.

18. The machine-readable storage medium as defined in claim 14, wherein the second permutation is a recursion function defined by the relationship $A_n=(A_n-1+c)$ modulo (a) where $A_n$ is the permuted index value, the value c is a prime number less than a, and an initial value of $A_0$ is defined to be zero.

19. A permutation generator for determining at least one permutation of a set of a K number of values comprising:
   a seed index generator configured to initialize a first index value to a set value within the set of K values;
   a first permutation unit configured to generate a first permuted value by receiving the first index value as an input and applying the first index value to a first permutation function, and to output the first permuted value as a first value in the at least one permutation; and
   a second permutation unit configured to generate a second index value based on the first index value by receiving the first index value as an input to a second predefined permutation function and to output the second index value to the first permutation generator.

20. The permutation generator as defined in claim 19, wherein the first permutation unit is further configured to generate a second permuted value by receiving the second index value as an input to the first permutation function, and to output the second permuted value as a second value in the at least one permutation.

21. The permutation generator as defined in claim 19, wherein the second permutation unit is configured to, for each of the remaining K values, determine a next index value by inputting the previous index value into the second permutation function, and the first permutation unit is configured to generate a next permutation value by inputting the next index value into the first permutation function and to output the next permuted value as the next value in the at least one permutation.

22. The permutation generator as defined in claim 21, wherein the first and second permutation units are further configured to determine at least a second permutation after determination of the at least one permutation.

23. The permutation generator as defined in claim 19, wherein the seed index generator further comprises a random number generator configured to generate the set value based on a random number determined by the random number generator.

24. The permutation generator as defined in claim 19, wherein the first permutation unit is further configured to generate the first permuted value by inputting the first index value into the first predefined permutation function including mapping the first index value to an array having an a number of rows and a b number of columns, where a is a prime number less than K and b is set to at least the value of K/a.

25. The permutation generator as defined in claim 24, wherein the first permutation unit is configured to effect an operation equivalent to writing the set of K number of values into the array row-wise and then reading the values out of the array column-wise to achieve a set of permuted mapped elements.

26. The permutation generator as defined in claim 25, wherein the first permutation unit is further configured to further remap a mapped permuted element having a value greater than the number of K values by using that element to remap when the array is sized such that the product of a and b is greater than K.

27. The permutation generator as defined in claim 24, wherein the second permutation unit is configured to effect an operation equivalent to permutation of the numbered rows of the array and permutation of the numbered columns of the array to generate a permutation of the index values within the array.

28. The permutation generator as defined in claim 24, wherein the second permutation unit is configured to perform a recursion function defined by the relationship $A_n=(A_n-1+c)$ modulo (a) where $A_n$ is the permuted index value, the value c is a prime number less than a, and an initial value of $A_0$ is defined to be zero.

29. A transceiver for use in a communication system comprising:
   at least one of an encoder and a decoder for encoding or decoding wireless signals through the use of at least one permutation; and
   a permutation generator for determining the at least one permutation of a set of a K number of values, the permutation generator comprising:
      a seed index generator configured to initialize a first index value to a set value within the set of K values;
      a first permutation unit configured to generate a first permuted value by inputting the first index value into a first permutation function and to output the first permuted value as a first value in the at least one permutation; and
      a second permutation unit configured to generate a second index value based on the first index value by receiving the first index value as an input to a second permutation function and to output the second index value to the first permutation generator.

30. The transceiver as defined in claim 29, wherein the first permutation unit is further configured to generate a second permuted value by receiving the second index value as an input to the first permutation function, and to output the second permuted value as a second value in the at least one permutation.

31. The transceiver as defined in claim 29, wherein the second permutation unit is configured to, for each of the remaining K values, determine a next index value by inputting the previous index value into the second permutation function, and the first permutation unit is configured to generate a next permutation value by inputting the next index value into the first permutation function and to output the next permuted value as the next value in the at least one permutation.

32. The transceiver as defined in claim 31, wherein the first and second permutation units are further configured to determine at least a second permutation after determination of the at least one permutation.

33. The transceiver as defined in claim 29, wherein the seed index generator is further comprises a random number generator configured to generate the set value based on a random number determined by the random number generator.

34. The transceiver as defined in claim 29, wherein the first permutation unit is further configured generate the first permuted value by inputting the first index value into the first predefined permutation function including mapping the first index value to an array having an a number of rows and a b number of columns, where a is a prime number less than K and b is set to at least the value of K/a.

35. The transceiver as defined in claim 34, wherein the first permutation unit is configured to effect an operation equivalent to writing the set of K number of values into the array row-wise and then reading the values out of the array column-wise to achieve a set of permuted mapped elements.

36. The transceiver as defined in claim 35, wherein the first permutation unit is further configured to further remap a mapped permuted element having a value greater than the number of K values by using that element to remap when the array is sized such that the product of a and b is greater than K.

37. The transceiver as defined in claim 34, wherein the second permutation unit is configured to effect an operation equivalent to permutation of the numbered rows of the array and permutation of the numbered columns of the array to generate a permutation of the index values within the array.

38. The transceiver as defined in claim 34, wherein the second permutation unit is configured to perform a recursion function defined by the relationship $A_n=(A_n-1+c)$ modulo $(a)$ where $A_n$ is the permuted index value, the value c is a prime number less than a, and an initial value of $A_0$ is defined to be zero.

39. An apparatus for transmitting symbols comprising:
   means for determining at least one permutation of a set of K number of values comprising:
      means for initializing a first index value to a set value within the set of K values;
      means for generating a first permuted value by inputting the first index value into a first permutation function;
      means for outputting the first permuted value as a first value in the at least one permutation;
      means for generating a second index value based on the first index value by inputting the first index value into a second permutation function;
      means for generating a second permuted value by inputting the second index value into the first permutation function; and
      means for outputting the second permuted value as a second value in the at least one permutation; and
   means for encoding the symbols based on the at least one permutation.

40. The apparatus as defined in claim 39, further comprising for each of the remaining K number of values:
   means for determining a next index value by inputting the previous index value into the second permutation function;
   means for generating a next permutation value by inputting the next index value into the first permutation function; and
   means for outputting the next permuted value as the next value in the at least one permutation.

41. The apparatus as defined in claim 40, further comprising:
   means for determining at least a second permutation after determination of the at least one permutation.

42. The apparatus as defined in claim 39, wherein the set value is a random number determined by a random number generator.

43. The apparatus as defined in claim 39, wherein generating the first permuted value by inputting the first index value into the first predefined permutation function includes mapping the first index to an array having an a number of rows and a b number of columns, where a is a prime number less than K and b is set to at least the value of K/a.

44. The apparatus as defined in claim 43, wherein the first permutation function effects the operation of writing the set of K number of values into the array row-wise and then reading the values out of the array column-wise to achieve a set of permuted mapped elements.

45. The apparatus as defined in claim 44, wherein the first permutation function includes further remapping of a mapped permuted element having a value greater than the number of K values by using that element to remap when the array is sized such that the product of a and b is greater than K.

46. The apparatus as defined in claim 43, wherein the second permutation function effects a permutation of the numbered rows of the array and a permutation of the numbered columns of the array to generate a permutation of the index values within the array.

47. The apparatus as defined in claim 43, wherein the second permutation is a recursion function defined by the relationship $A_n=(A_n-1+c)$ modulo $(a)$ where $A_n$ is the permuted index value, the value c is a prime number less than a, and an initial value of $A_0$ is defined to be zero.

* * * * *